(12) United States Patent
Mirichigni

(10) Patent No.: US 9,513,992 B2
(45) Date of Patent: ***Dec. 6, 2016

(54) METHOD AND APPARATUS TO PERFORM CONCURRENT READ AND WRITE MEMORY OPERATIONS

(71) Applicant: Micron Technology, Inc., Boise, ID (US)

(72) Inventor: Graziano Mirichigni, Vimercate (IT)

(73) Assignee: MICRON TECHNOLOGY, INC., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/793,475

(22) Filed: Jul. 7, 2015

(65) Prior Publication Data

US 2015/0309868 A1 Oct. 29, 2015

Related U.S. Application Data

(63) Continuation of application No. 14/074,360, filed on Nov. 7, 2013, now Pat. No. 9,208,019, which is a
(Continued)

(51) Int. Cl.
*G06F 11/10* (2006.01)
*H03M 13/29* (2006.01)
(Continued)

(52) U.S. Cl.
CPC ....... *G06F 11/1048* (2013.01); *G06F 11/1016* (2013.01); *G06F 11/1044* (2013.01);
(Continued)

(58) Field of Classification Search
CPC .............. G06F 11/1076; G06F 11/1084; G06F 11/1096; G06F 11/1092; G06F 11/1088; G06F 11/108; G11C 2211/5623; G11C 2013/0088
See application file for complete search history.

(56) References Cited

U.S. PATENT DOCUMENTS 5,663,922 A 9/1997 Tailliet
5,680,579 A * 10/1997 Young .................. G06F 3/0601
711/100

(Continued)

FOREIGN PATENT DOCUMENTS

CN 1379409 11/2002
CN 101681305 3/2010
(Continued)

OTHER PUBLICATIONS

Chinese Patent Office Action dated Mar. 4, 2014 issued in Chinese Patent Application 201110370020.4.*
(Continued)

*Primary Examiner* — Joseph Schell
(74) *Attorney, Agent, or Firm* — Hollard & Hart LLP

(57) ABSTRACT

Subject matter disclosed herein relates to read and write processes of a memory device. During a write process to a particular partition in a memory array, a response to a read request of contents of the particular partition may be delayed. In some embodiments, the contents of the particular partition may be indirectly read during the write process without delaying the response to the read request. The contents of the particular partition can be indirectly read by determining the contents of the particular partition based, at least in part, on an error correction code based, at least in part, on contents of memory partitions of the memory array.

20 Claims, 7 Drawing Sheets

Related U.S. Application Data continuation of application No. 12/947,771, filed on Nov. 16, 2010, now Pat. No. 8,583,987.

(51) Int. Cl.

| | | |
|---|---|---|
| *H03M 13/00* | (2006.01) | |
| *G11C 13/00* | (2006.01) | |
| *G11C 29/52* | (2006.01) | |
| *H03M 13/15* | (2006.01) | |
| *H03M 13/19* | (2006.01) | |
| *H03M 13/23* | (2006.01) | |

(52) U.S. Cl.
CPC ...... *G06F 11/1072* (2013.01); *G06F 11/1096* (2013.01); *G11C 13/004* (2013.01); *G11C 13/0004* (2013.01); *G11C 13/0061* (2013.01); *G11C 13/0069* (2013.01); *G11C 29/52* (2013.01); *H03M 13/2909* (2013.01); *H03M 13/6561* (2013.01); *G11C 2211/5623* (2013.01); *H03M 13/152* (2013.01); *H03M 13/1515* (2013.01); *H03M 13/19* (2013.01); *H03M 13/23* (2013.01)

(56) References Cited

U.S. PATENT DOCUMENTS

| | | | |
|---|---|---|---|
| 5,848,229 A | 12/1998 | Morita | |
| 5,913,926 A | 6/1999 | Anderson et al. | |
| 5,914,970 A | 6/1999 | Gunsaulus et al. | |
| 5,958,067 A * | 9/1999 | Kaneda | G06F 3/0613 |
| | | | 714/6.1 |
| 6,321,345 B1 | 11/2001 | Mann et al. | |
| 6,477,101 B2 | 11/2002 | Cavaleri et al. | |
| 6,529,435 B2 | 3/2003 | Yagishita et al. | |
| 6,535,452 B2 | 3/2003 | Okuda et al. | |
| 6,807,609 B1 | 10/2004 | Lemmon et al. | |
| 7,114,117 B2 | 9/2006 | Tamura et al. | |
| 7,529,145 B2 | 5/2009 | La Rosa et al. | |
| 7,694,031 B2 | 4/2010 | Talbot | |
| 7,881,145 B2 | 2/2011 | Lee et al. | |
| 8,132,044 B1 * | 3/2012 | Saeed | G06F 11/1088 |
| | | | 714/6.1 |
| 8,149,643 B2 | 4/2012 | Tzou et al. | |
| 8,200,887 B2 | 6/2012 | Bennett | |
| 8,583,987 B2 * | 11/2013 | Mirichigni | G06F 11/1044 |
| | | | 711/150 |
| 9,208,019 B2 * | 12/2015 | Mirichigni | G06F 11/1044 |
| 2002/0083391 A1 | 6/2002 | Huggett et al. | |
| 2002/0141270 A1 | 10/2002 | Yagishita et al. | |
| 2003/0035322 A1 | 2/2003 | Wong | |
| 2005/0005230 A1 * | 1/2005 | Koga | G06F 11/1008 |
| | | | 714/800 |
| 2006/0123271 A1 * | 6/2006 | Forhan | G06F 11/1076 |
| | | | 714/6.32 |
| 2007/0168706 A1 | 7/2007 | Humlicek | |
| 2008/0168331 A1 * | 7/2008 | Vogelsang | G06F 11/1044 |
| | | | 714/770 |
| 2009/0303807 A1 | 12/2009 | Lee et al. | |
| 2010/0172180 A1 | 7/2010 | Paley et al. | |
| 2012/0124317 A1 | 5/2012 | Mirichigni et al. | |
| 2012/0124449 A1 | 5/2012 | Mirichigni | |
| 2012/0221922 A1 | 8/2012 | Bennett | |
| 2014/0068380 A1 | 3/2014 | Mirichigni | |

FOREIGN PATENT DOCUMENTS

| | | |
|---|---|---|
| CN | 102567242 A | 7/2012 |
| DE | 10 2011 085 989 A | 6/2012 |
| JP | 11-073773 | 3/1999 |
| JP | 2002-298578 | 10/2002 |
| JP | 2004-040697 | 2/2004 |
| JP | 5464528 B2 | 4/2014 |
| KR | 10-2012-0052883 A | 5/2012 |
| TW | 201037728 A | 10/2010 |
| TW | 201227292 A | 7/2012 |
| WO | WO 2008/022162 | 2/2008 |

OTHER PUBLICATIONS

German Patent Office Action dated Jul. 1, 2015 issued in German Patent Application 10 2011 085 989.6.*

Numonyx, 128-Mbit, 1.8 V, multiple I/O, 4-Kbyte subsector erase on boot sectors, XiP enabled, serial flash memory with 108 MHz SPI bus interface, www.numonyx.com, Feb. 2010, 185 pages.

* cited by examiner

METHOD AND APPARATUS TO PERFORM CONCURRENT READ AND WRITE MEMORY OPERATIONS

INCORPORATION BY REFERENCE TO ANY PRIORITY APPLICATIONS

Any and all applications for which a foreign or domestic priority claim is identified in the Application Data Sheet as filed with the present application are incorporated by reference and made a part of this specification.

BACKGROUND

1. Field

Subject matter disclosed herein relates to read and write processes of a memory device.

2. Information

Memory devices are employed in many types of electronic devices, such as computers, cell phones, PDA's, data loggers, and navigational equipment, just to name a few examples. Among such electronic devices, various types of nonvolatile memory devices may be employed, such as NAND or NOR flash memories and phase-change memory (PCM), just to name a few examples. In general, writing or programming processes may be used to store information in such memory devices, while a read process may be used to retrieve stored information.

Some types of memory devices comprise a memory cell array partitioned into groups of memory cells, such as pages, blocks, partitions, and so on. In such cases, memory cells within such a group may share common electronic circuitry including sense amplifiers, and row/column decoders, for example. Accordingly, both reading from and writing to such a group of memory cells may involve some common electronic circuitry. In such a case, a pending write operation occurring in one portion of such a group of memory cells may prevent a read operation from occurring in another portion of the same group of memory cells. Such a limiting condition may result in slower read operations and overall reduced performance of a memory device.

BRIEF DESCRIPTION OF THE FIGURES

Non-limiting and non-exhaustive embodiments will be described with reference to the following figures, wherein like reference numerals refer to like parts throughout the various figures unless otherwise specified.

DETAILED DESCRIPTION

Figure 1:
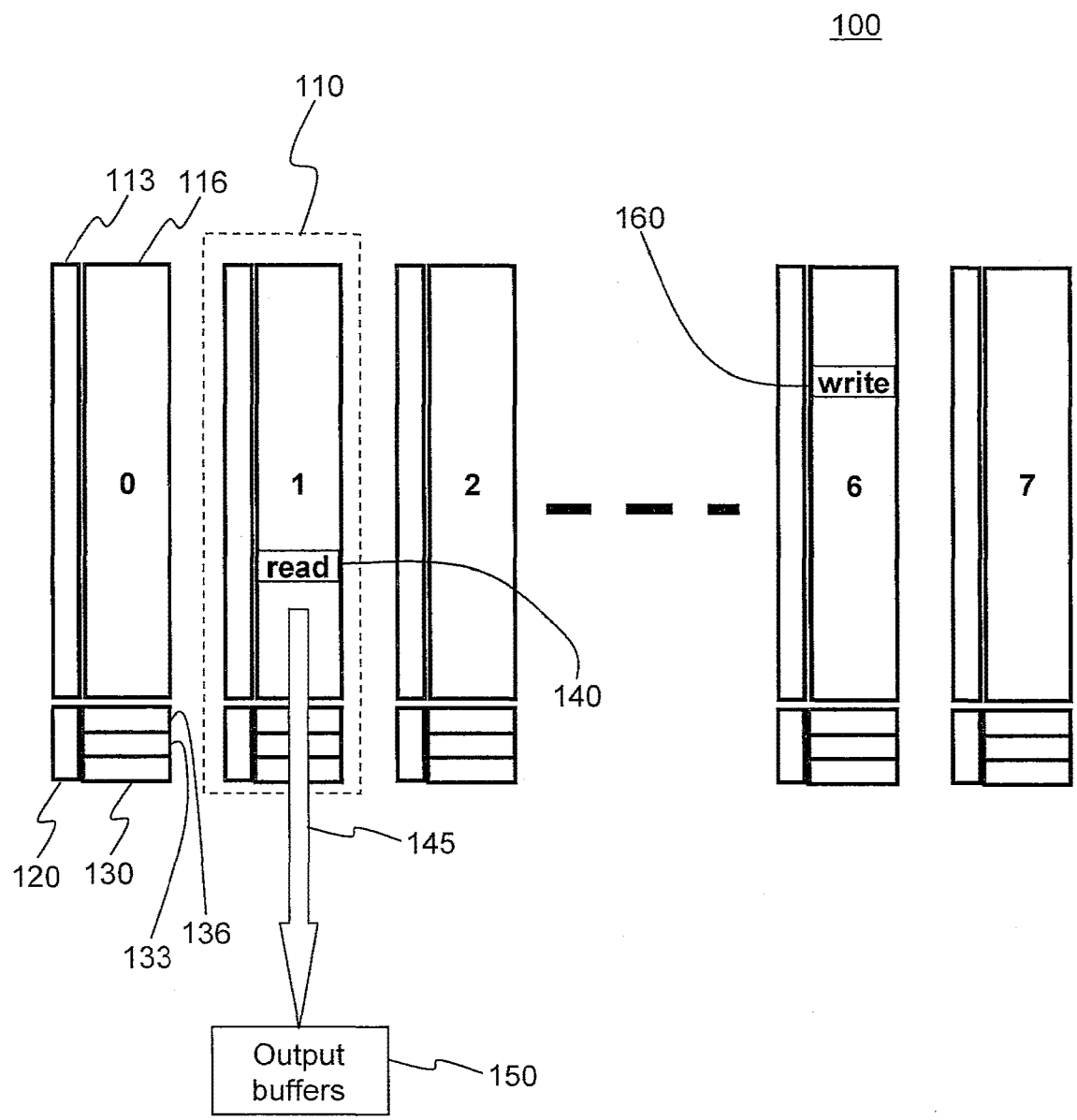
FIGS. 1-4 are schematic diagrams of a portion of memory, according to an embodiment.

Reference throughout this specification to "one embodiment" or "an embodiment" means that a particular feature, structure, or characteristic described in connection with the embodiment is included in at least one embodiment of claimed subject matter. Thus, the appearances of the phrase "in one embodiment" or "an embodiment" in various places throughout this specification are not necessarily all referring to the same embodiment. Furthermore, the particular features, structures, or characteristics may be combined in one or more embodiments.

In an embodiment, a memory device, such as NAND, NOR, or PCM flash, may comprise a memory array partitioned into groups of memory cells called partitions. Memory cells within such partitions may share common electronic circuitry including sense amplifiers, and row/column decoders, for example. In an implementation, a memory array, in addition to including a plurality of partitions in which to store user data, may include an error correction code (ECC) partition to store ECC. Such ECC may be used to supplement data with parity bits that include enough extra information for the data to be reconstructed if one or more bits of the data become corrupted. For example, such an ECC may be applied during a process of reading stored data and/or a process of verify-after-writing data. An ECC may comprise a string of data supplemented with parity bits. A process to construct an ECC may be based, at least in part, on a particular application being used. In a particular implementation, an ECC may be based, at least in part, on parallel encoding and decoding techniques. Such techniques may involve a 1-bit error correcting binary Hamming code, a more than 1-bit error correcting binary Bose-Chaudhuri-Hocquenghem (BCH) code, non binary Reed-Solomon code, or a Convolutional code, just to name a few examples.

In an embodiment, ECC may be used in a technique to perform a read-while-write operation in a particular partition of a memory array. In such a technique, instead of being used to detect and correct errors, as described above for example, ECC may be used to encode information representative of contents in one or more partitions of a memory array so that such contents may, at a later time, be read during a concurrent write operation. Such ECC may be written to and stored in an ECC partition that may be separate and distinct from the one or more partitions in a memory array used to store data. Herein, such partitions used to store data such as user data that may be programmed to the partitions or read from the partitions will be called data partitions to distinguish from an ECC partition, for example. In particular, an ECC partition may contain ECC based, at least in part, on data stored in a number of data partitions. For example, if data is written to data partitions one through eight, ECC may be calculated based on the data written to data partitions one through eight. Such calculated ECC may then be stored in an ECC partition and used at a later time in a process to determine contents of any one of data partitions one through eight, for example. Such a process of determining contents of a data partition may be performed in lieu of directly reading such contents. Here, the term "directly reading" refers to a process of sensing a state of one or more memory cells via sense amplifiers and other circuitry. In contrast, a state of one or more memory cells may be "indirectly read" by inferring or determining such a state without a process of sensing the memory cells, as described below. Directly reading contents of a block of a data partition may not be permitted during a pending write operation in the same data partition, because a suspend operation may be required, for example. However, as described in detail below, according to a particular embodiment, indirectly reading contents of a block of a data partition may be performed even if such a block belongs to a data partition that is currently busy being written to. In one implementation, a technique to perform such a read-while-write operation (e.g., an indirect read) of a block or other portion of a particular data partition may include determining contents of the block or other portion based, at least in part, on contents in other data partitions and an ECC partition. Thus, performance of a memory device may be improved if an operation to write to a particular data partition need not be suspended until completion of an operation to read from the same data partition.

In an embodiment, a technique to concurrently perform a read-while-write operation in a data partition of a memory device may comprise calculating an ECC based, at least in part, on contents of individual data partitions in a memory. Such ECC may be maintained in an ECC partition, for example. Such ECC may correspond to a particular portion or block of the individual data partitions. For example, an ECC for block 2 may comprise an ECC calculated using contents of block 2 of the individual data partitions. Another ECC for block 3 may comprise an ECC calculated using contents of block 3 of the individual data partitions, and so on. Such values of ECC (e.g., ECC for block 2, ECC for block 3, and so on) may be stored in an ECC partition. Using such ECC, for example, contents of a block of a particular data partition may be indirectly read based, at least in part, on contents of corresponding blocks of data partitions other than the particular data partition and the ECC corresponding to the block, as explained in detail below. In one implementation, contents of data partitions other than such particular data partition may be read serially or in parallel with one another via a line or bus in a process of indirectly reading contents of the particular data partition.

As mentioned above, a write operation may prevent a direct read process of a data partition from occurring in the same data partition. Such write operations may be initiated by a processor executing an application, for example. Such write operations may also be initiated by a memory microcontroller embedded in the memory device or stacked with the memory device, during any of a number of internal memory processes. For example, a memory microcontroller may initiate write operations in one or more partitions of a memory array to perform wear leveling, garbage collection, bad block management, and/or refresh processes. Such processes may comprise background operations not visible to a processor and/or user at an application level, for example. Embodiments described herein may allow such write operations to occur without a need to suspend such internal memory processes.

In one embodiment, ECC may be calculated and/or updated in response to data being written to one or more data partitions in a memory array. As mentioned above, ECC may be based, at least in part, on such data. In particular, a process to calculate ECC may include directly reading contents of data partitions and using such contents in the ECC calculations. In an implementation, an incoming read request (e.g. initiated by a processor or memory microcontroller) may conflict with read operations involved in ECC calculations. Accordingly, in one case, such an incoming read request may be denied if individual data partitions are busy with ECC calculations. In another case, however, one or more processes involving ECC calculations may be suspended so that an incoming read request need not be denied. After performing the incoming read request, one or more processes involving ECC calculations may be resumed, though claimed subject matter is not so limited.

In an embodiment, a technique to read-while-write in a data partition of a memory array may be performed in a memory device comprising an ECC partition to store ECC, and a memory microcontroller to calculate ECC based, at least in part, on contents of individual data partitions in the memory array. Such a memory microcontroller may initiate a read command to read contents of a first portion of a particular data partition while writing to a second portion of the same data partition. The read portion may be the same as the write portion, but until the write operation is finished only the old content may be read. Contents of the first portion may be determined (e.g., indirectly read) based, at least in part, on ECC stored in an ECC partition. Contents of the first portion may also be determined based, at least in part, on contents of other data partitions. Thus, contents of the first portion of the data partition need not be read directly, but may instead be indirectly read using ECC and contents in other data partitions. In an implementation, the first portion and the second portion of the data partition may share at least one group of sense amplifiers, for example, though claimed subject matter is not so limited.

FIG. 1 is a schematic diagram of a portion 100 of memory, according to an embodiment. For example, such a memory may comprise NAND, NOR, or PCM flash memory that may be organized in data partitions of memory cells. In following descriptions, such a portion of memory may be described as comprising eight data partitions. Such a particular number of data partitions is merely described for sake of convenience and to simplify explanation and understanding. It is to be understood, however, that the number of data partitions involved in embodiments described herein is not limited to any particular number, and claimed subject matter is not limited in this respect. Continuing with the description of FIG. 1, memory portion 100 may include a number (e.g., eight) of data partitions 110. In one implementation, such data partitions may comprise memory cell array 116, row decoder 113, column decoder 136, program loads 133 (e.g., used during write operations to determine memory cells to be written), one or more sense amplifiers 130, and other circuitry 120 involved in read/write operations of the associated data partition, for example.

Figure 2:
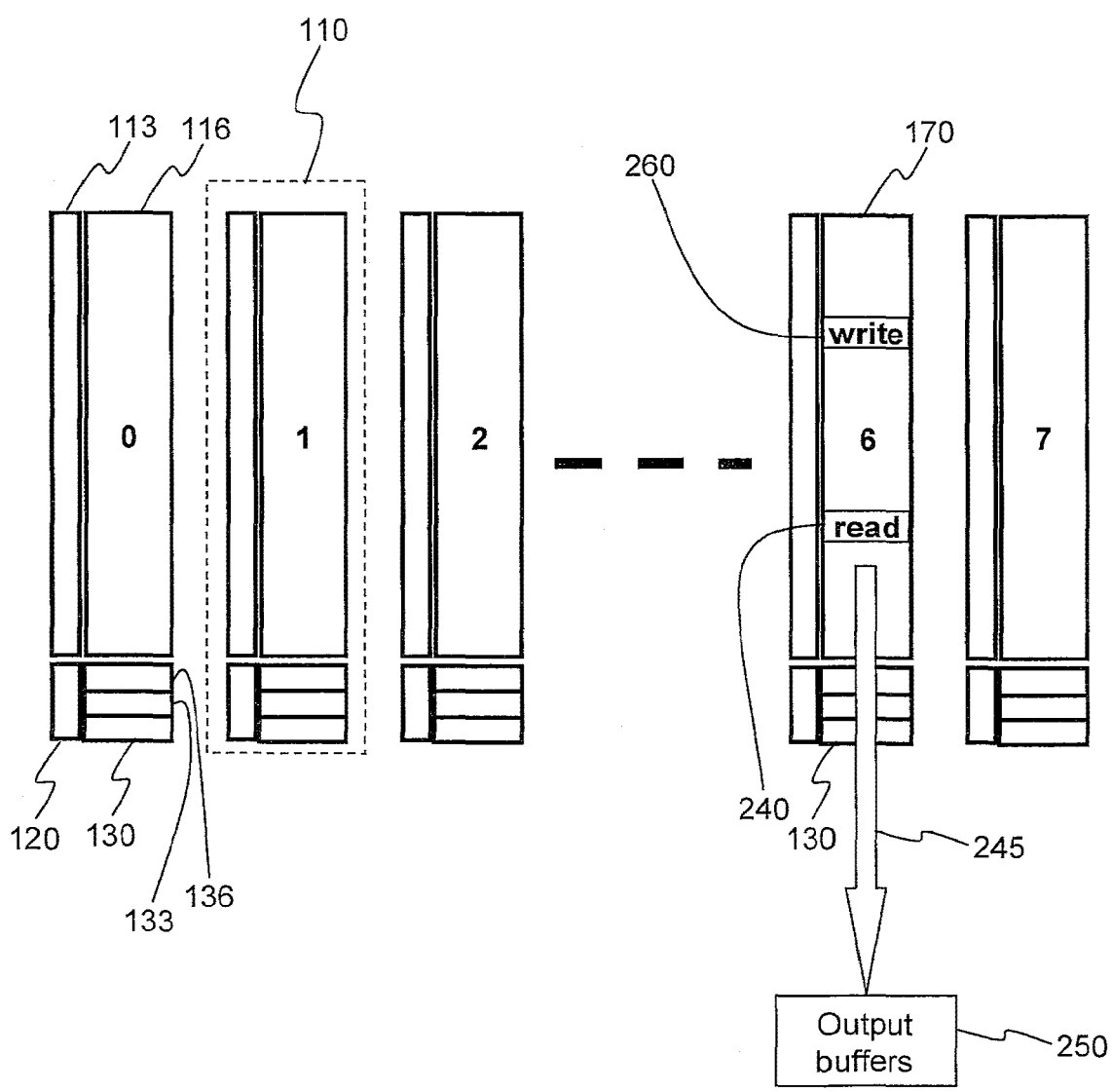

In an implementation, a read operation to directly read from one data partition may occur concurrently with a write operation to write to a different data partition. In such a case, no contention or conflict need occur because, among a number of reasons, such data partitions may include their own read circuitry (e.g., sense amplifiers) and/or row and column decode circuitry, for example. So for a particular example, read operation 140 to directly read from data partition 1 may occur concurrently with write operation 160 to write to data partition 6. Read operation 140 may include a process 145 of measuring states of read memory cells in data partition 1 via sense amplifiers 130 and writing data representative of the states into an output buffer 150, for example FIG. 2 is a schematic diagram of portion 100 of memory, according to another embodiment. As mentioned above, a read operation to directly read from one data partition may occur concurrently with a write operation to write to a different data partition. In a case shown to be occurring in data partition 170, however, a conflict may occur. In particular, read operation 240 to directly read from one block of data partition 6 may not be able to occur concurrently with write operation 260 to write to another block of data partition 6. In one implementation, for example, upon receiving a command (e.g., from an external processor or from a portion of an internal memory microcontroller) to perform read operation 240, write operation 260 may be suspended until read operation 240 is complete. In another implementation, a command to perform read operation 240 may be denied and/or delayed until write operation 260 is complete. In either implementation, read operation 240 may include a process 245 of measuring states of read memory cells in partition 6 via sense amplifiers 130 and writing data representative of the states into an output buffer 250, for example.

Figure 3:
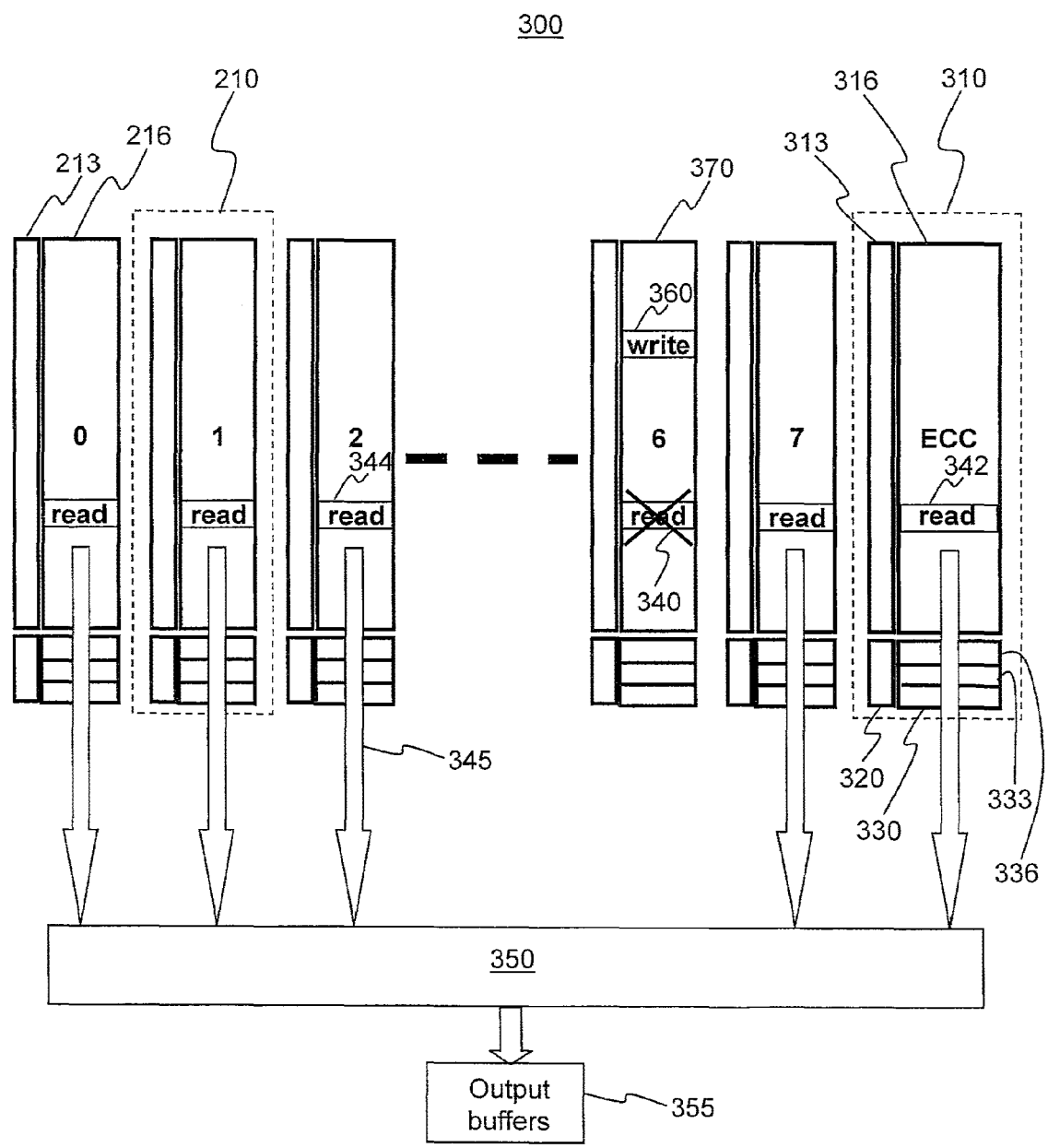

FIG. 3 is a schematic diagram of a portion 300 of memory, according to an embodiment. Similar to the memory comprising portion 100 described above, such a memory may comprise NAND, NOR, or PCM flash memory that may be organized in partitions of memory cells. However, memory portion 300 may comprise ECC partition 310 in addition to eight data partitions described above in FIGS. 1 and 2. (Again, it is understood that claimed subject matter is not limited to any particular number of data partitions.) In one implementation, such a ECC partition 310 may comprise memory cell array 316, row decoder 313, column decoder 336, program loads 333, one or more sense amplifiers 330, and other circuitry 320 involved in read/write operations of the ECC partition, for example. Although sizes (e.g., the number of memory cells) of memory cell arrays 216 of data partitions 0 through 7 may be substantially equal to one another, the size of memory cell array 316 for ECC partition 310 may be different. For example, memory cell array 316 may be substantially larger than memory cell array 216 of data partition 0 or memory cell array 370 of data partition 6. A particular size of memory cell array 316 may be based, at least in part, on particular details of ECC techniques used to calculate ECC to be stored in memory cell array 316, number and size of data partitions, size of blocks or pages in data partitions, and so on.

As described above, a read operation to directly read from one data partition may occur concurrently with a write operation to write to a different data partition, since no contention or conflict need occur. So for a particular example, read operation 344 to read from a block in data partition 2 may occur concurrently with write operation 360 to write to a block in data partition 6. However, read operation 340 to directly read from a block in data partition 6 may not be able to occur concurrently with write operation 360 to write to the same or another block of the same data partition 6, for example. Nevertheless, embodiments described herein include techniques to indirectly read contents of a portion of a data partition while another portion of the same data partition is being programmed. Such techniques may utilize ECC stored in ECC partition 310. Thus, for example, while write operation 360 is occurring in a first block of data partition 6, contents of a second block of data partition 6 that are to be read by read operation 340 need not be determined by directly reading from the second block. The first and second block may be the same, but until the write operation is finished only the old content may be read. Instead, such contents may be indirectly read and determined based on contents of corresponding blocks of ECC partition and data partitions 0 through 5 and 7 (e.g., all data partitions other than data partition 6), as explained in detail below. In an implementation, such ECC may have been calculated during the most recent time the second block of data partition 6 and/or any of the other data partitions were programmed. Such ECC may have been calculated based, at least in part, on data that was programmed during this most recent time. Details of such ECC calculation are now described.

In an implementation, data partitions may comprise a number of blocks, wherein a block may comprise bits, bytes, words, groups of words, and so on. For example, a 1-Gbit memory device may include 8 data partitions, wherein such a data partition may comprise 64 blocks. Blocks may have a size of 256-kBytes and be organized in pages of 16 words or 32 bytes of data that may be read in parallel by a group of sense amplifiers, though claimed subject matter is not limited in this respect. To establish notation, a term to express contents of a particular block within a particular partition may be written as PxBy, where x is a partition number and y is a block within partition number x. For example, contents of block 23 in partition 0 may be written as P0B23, contents of block 36 of data partition 4 may be written as P4B36, and so on. Accordingly, using such notation, ECC of blocks of data partitions 0 through 7 may be written as a function of the contents of the blocks of data partitions 0 through 7 used in the calculations of ECC, as follows:

$$\text{block 0 ECC} = f(P0B0, P1B0, P2B0, P3B0, P4B0, P5B0, P6B0, P7B0)$$

$$\text{block 1 ECC} = f(P0B1, P1B1, P2B1, P3B1, P4B1, P5B1, P6B1, P7B1)$$

$$\text{block 2 ECC} = f(P0B2, P1B2, P2B2, P3B2, P4B2, P5B2, P6B2, P7B2),$$

and so on. Such a function $f$ may comprise any of a number of operations and/or algorithms. For example, in one implementation, such a function may involve a concatenation of contents of the blocks of data partitions 0 through 7. In another implementation, such a function may involve a combination of Boolean operations. Details of such a function may vary from one particular situation to another, and claimed subject matter is not limited in this respect.

Returning to FIG. 3, as already explained, read operation 340 to directly read from a block in data partition 6 may not be able to occur concurrently with write operation 360 to write to a block in the same data partition 6, for example. To describe such a case in terms of blocks introduced above, as a particular example, read operation 340 to directly read block 2 of data partition 6 may not be able to occur concurrently with write operation 360 to write to block 0 of the same data partition 6. However, while write operation 360 is programming block 0 of data partition 6, contents of block 2 of data partition 6 that are to be read by read operation 340 need not be determined by directly reading from block 2 of data partition 6. Instead, such contents may be indirectly read based on contents of block 2 ECC 342 and contents of block 2 of data partitions 0 through 5 and 7. Accordingly, contents of block 2 of data partition 6 may be written as a function of ECC and the contents of the blocks of data partitions 0 through 5 and 7 used in the calculations of ECC for block 2, as follows:

$$P6B2 = g(P0B2, P1B2, P2B2, P3B2, P4B2, P5B2, P7B2, \text{block 2 ECC})$$

Such a function $g$ may comprise any of a number of operations and/or algorithms. For example, in one implementation, at least a portion of such a function $g$ may comprise an inverse function of $f$ described above. The expression above implies that data of block 2 of data partition 6 may be inferred or determined from block 2 ECC 342 and data in block 2 of the other data partitions. This may hold true because block 2 ECC 342 was previously calculated based, at least in part, on data in block 2 of data partition 6 and data in block 2 of the other data partitions. Thus, in order to perform read operation 340 to directly read data of block 2 of data partition 6, such data may instead be indirectly read using block 2 ECC 342 and data in block 2 of the other data partitions. Accordingly, such a read operation may include a process 345 of directly reading data in block 2 of the data partitions 0 through 5 and 7 and a process of directly reading data in block 2 ECC 342 of ECC partition 310. Such read data may be provided to calculation block 350, which may comprise a portion of a memory microcontroller, for example. Calculation block 350 may perform one or more operations to indirectly read data of block 2 of data partition 6 using block 2 ECC 342 and data in block 2 of the other data partitions. Calculation block 350 may subsequently provide data of block 2 of data partition 6 to an output buffer 355 where such data may be available to a processor, for example, as read data resulting from read operation 340.

Figure 4:
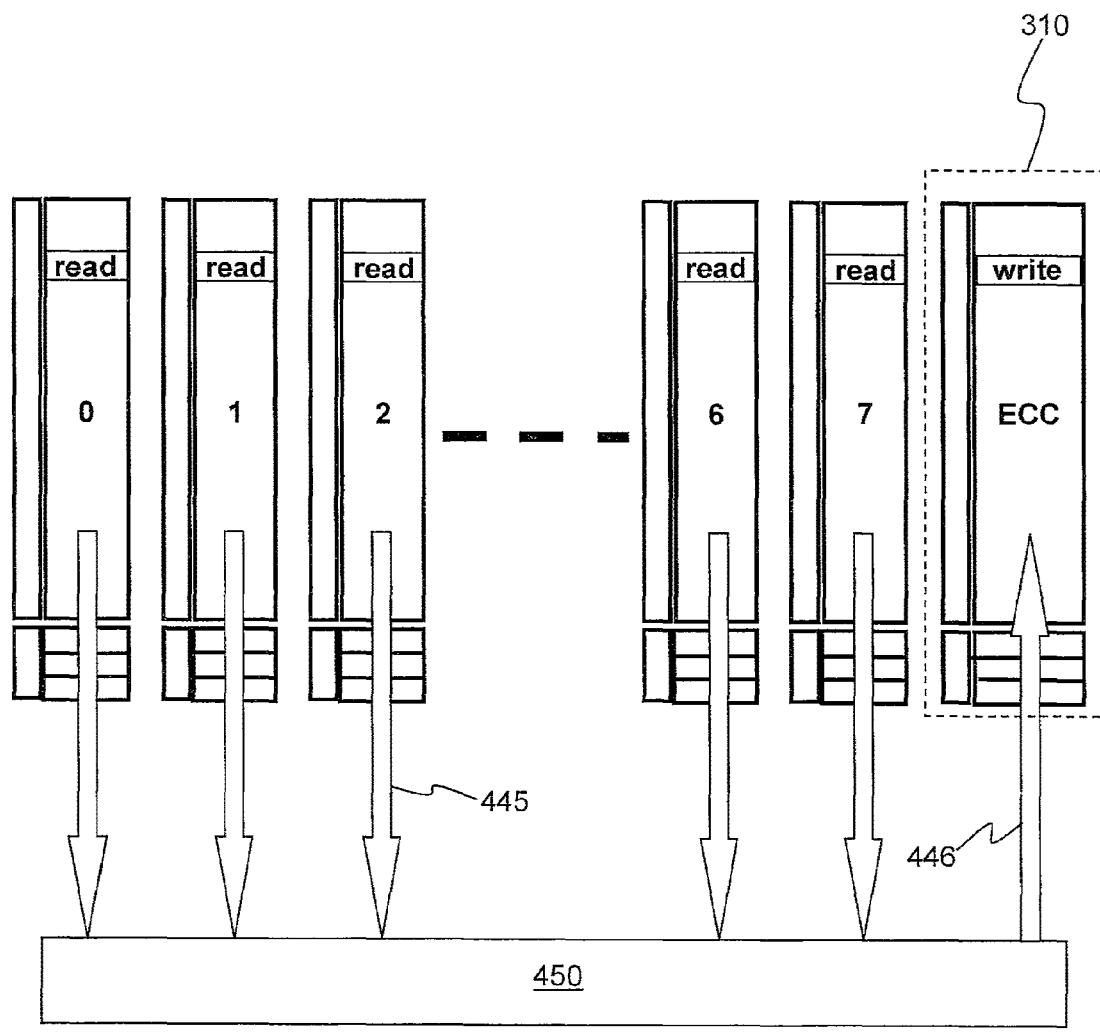

FIG. 4 is a schematic diagram of portion 300 of memory during a process of calculating ECC, according to an embodiment. Such a process may be initiated by a memory microcontroller, for example, subsequent to or during one or more operations to write data to one or more data partitions. As discussed above, ECC may be calculated based, at least in part, on such data in corresponding blocks of data partitions 0 through 7. For example, block 2 ECC may be calculated based, at least in part, on data in block 2 of data partitions 0 through 7. Accordingly, a process of calculating ECC may include a process 445 of directly reading data in block 2 of the data partitions 0 through 7 and providing read data to ECC calculation block 450. In one implementation, ECC calculation block 450 may comprise a portion of a memory microcontroller. After calculating ECC for block 2, calculation block 450 may provide ECC in a process 446 of writing calculated ECC to ECC partition 310. Next, a process of calculating ECC for subsequent blocks (e.g., block 3, block 4, and so on) may be performed using the process described above for the individual blocks. Of course, such details of calculating ECC are merely examples, and claimed subject matter is not so limited.

Figure 5:
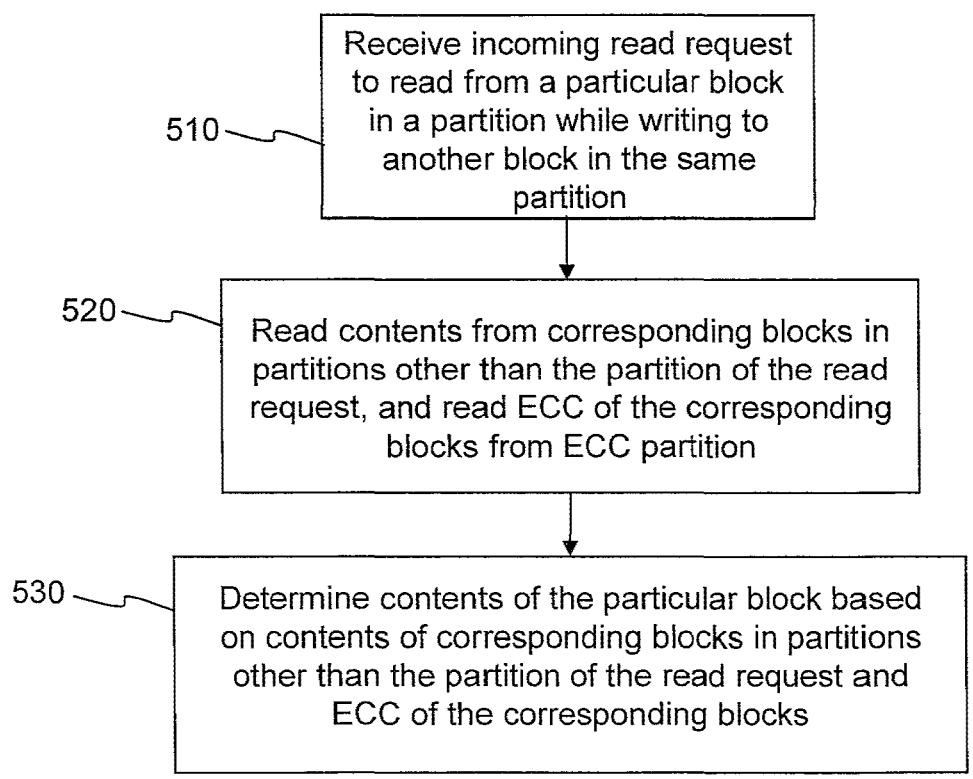
FIG. 5 is a flow diagram of a process to read from a partition of memory, according to an embodiment.

FIG. 5 is a flow diagram of a process 500 to indirectly read from a data partition of a memory array, according to an embodiment. Such a process may be performed by a memory device comprising portion 300, as described above, for example. In particular, as in rectangle 510, such a process may be performed in response to receiving a request to read from a particular block in a data partition of the memory array while a write operation is occurring in the same data partition. Such a request may be initiated by a processor executing an application and/or a memory microcontroller performing write operations in one or more data partitions of the memory array to perform wear leveling, garbage collection, bad block management, and/or refresh processes, for example. As explained above, a read operation to directly read from a particular block in a data partition may not be able to occur concurrently with a write operation to write to another block of the same data partition. Thus, instead of directly reading from the particular block of the data partition, contents of the particular block may be indirectly read using contents of corresponding blocks of other data partitions and ECC of the corresponding blocks. Accordingly, as in rectangles 520 and 530, contents of corresponding blocks of the other data partitions and contents of ECC of the corresponding blocks from ECC partition may be directly read and used to indirectly read contents of the particular block.

Figure 6:
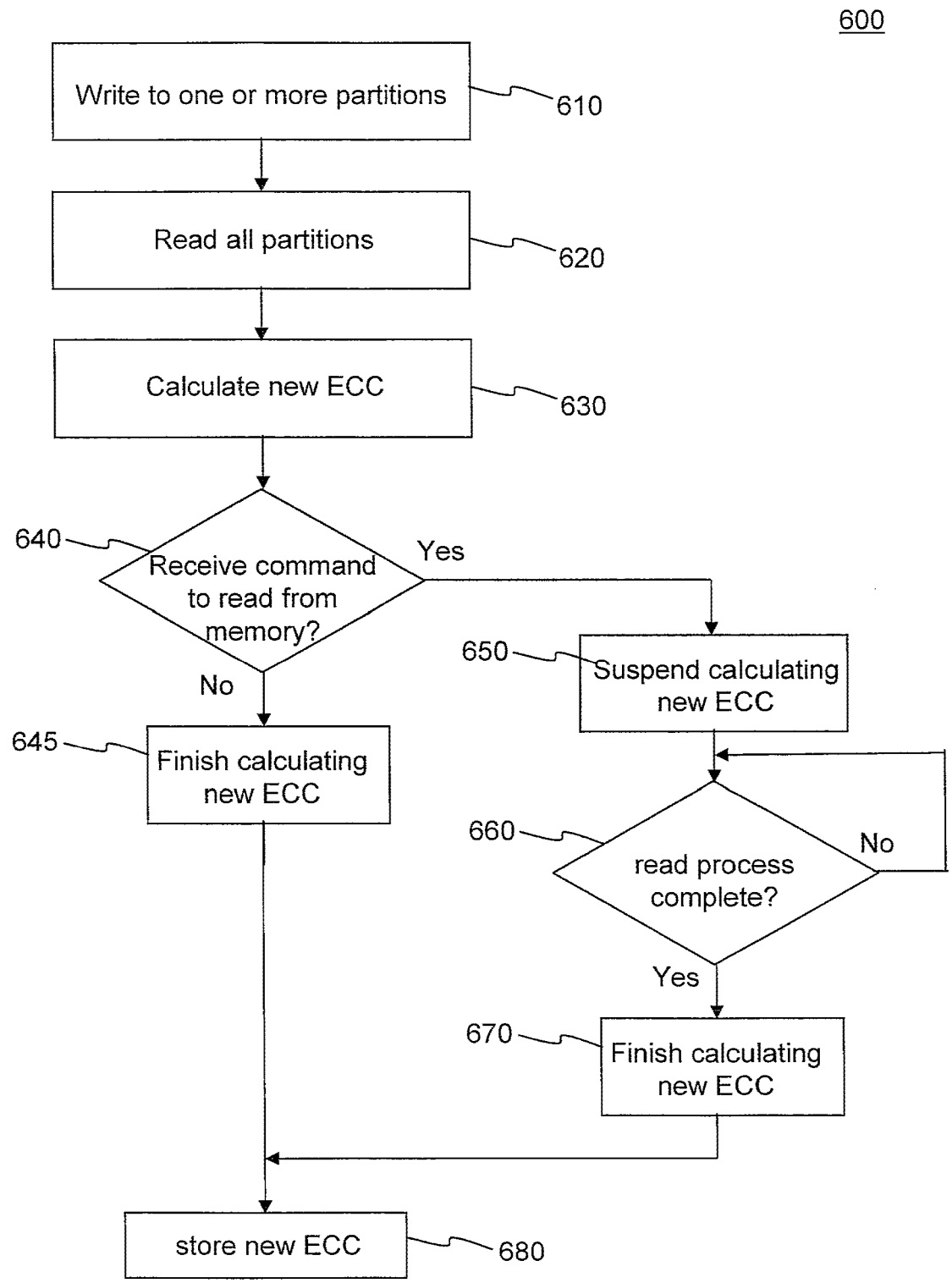
FIG. 6 is a flow diagram of a process to update an error correction code (ECC) partition of memory, according to an embodiment.

FIG. 6 is a flow diagram of a process 600 to update an ECC partition of memory, according to an embodiment. Such a process may be performed by a memory microcontroller of a memory device comprising portion 300, as described above, for example. In particular, as in rectangle 610, such a process may be performed in response to receiving a request to write to one or more data partitions of a memory array. For example, if new data is written to such data partitions of a memory array, an updated ECC based, at least in part, on the new data may be calculated. Such updated ECC may replace older ECC stored in an ECC partition, such as ECC partition 310 shown in FIG. 3, for example. ECC may be calculated using any of a number of processes or algorithms, which may use new data written to data partitions of a memory array as well as older data stored in the data partitions. In an implementation, a particular ECC may be calculated based, at least in part, on corresponding blocks across the data partitions of a memory array. For example, if individual data partitions comprise 64 blocks, ECC partition 310 may store 64 values of ECC corresponding to the blocks. Of course, such a number of data partitions and ECC values is merely an example, and claimed subject matter is not so limited. In rectangle 620, data of corresponding blocks across data partitions may be directly read. In rectangle 630, ECC may be calculated using such read data.

In a particular implementation, at least portions of process 600 may be suspended to allow a read to be performed for an incoming read command. Such portions of process 600 may then be resumed after such a read is completed. Such a suspension of a process to update ECC may result in improved read performance of a memory device since a read command (initiated by a processor, for example) need not be delayed. Thus, at diamond 640, a determination is made whether a read command is being received. If not, then process 600 may proceed to rectangle 645, wherein a process of calculating ECC is completed. After completion, in rectangle 680, calculated ECC may be written to an ECC partition of the memory device. On the other hand, if a read command is received at diamond 640, process 600 may proceed to rectangle 650 to suspend calculating ECC. During such a suspension, monitoring progress of a read process resulting from the incoming read command may determine whether such a read process is complete, as in diamond 660. If the read process is not complete, process 600 may loop back to diamond 660, to continue to monitor progress of the read process. On the other hand, if the read process is complete, process 600 may proceed to block 670, wherein a process of calculating ECC is completed. After completion, in rectangle 680, calculated ECC may be written to an ECC partition of the memory device. Of course, such details of process 600 are merely examples, and claimed subject matter is not so limited.

Figure 7:
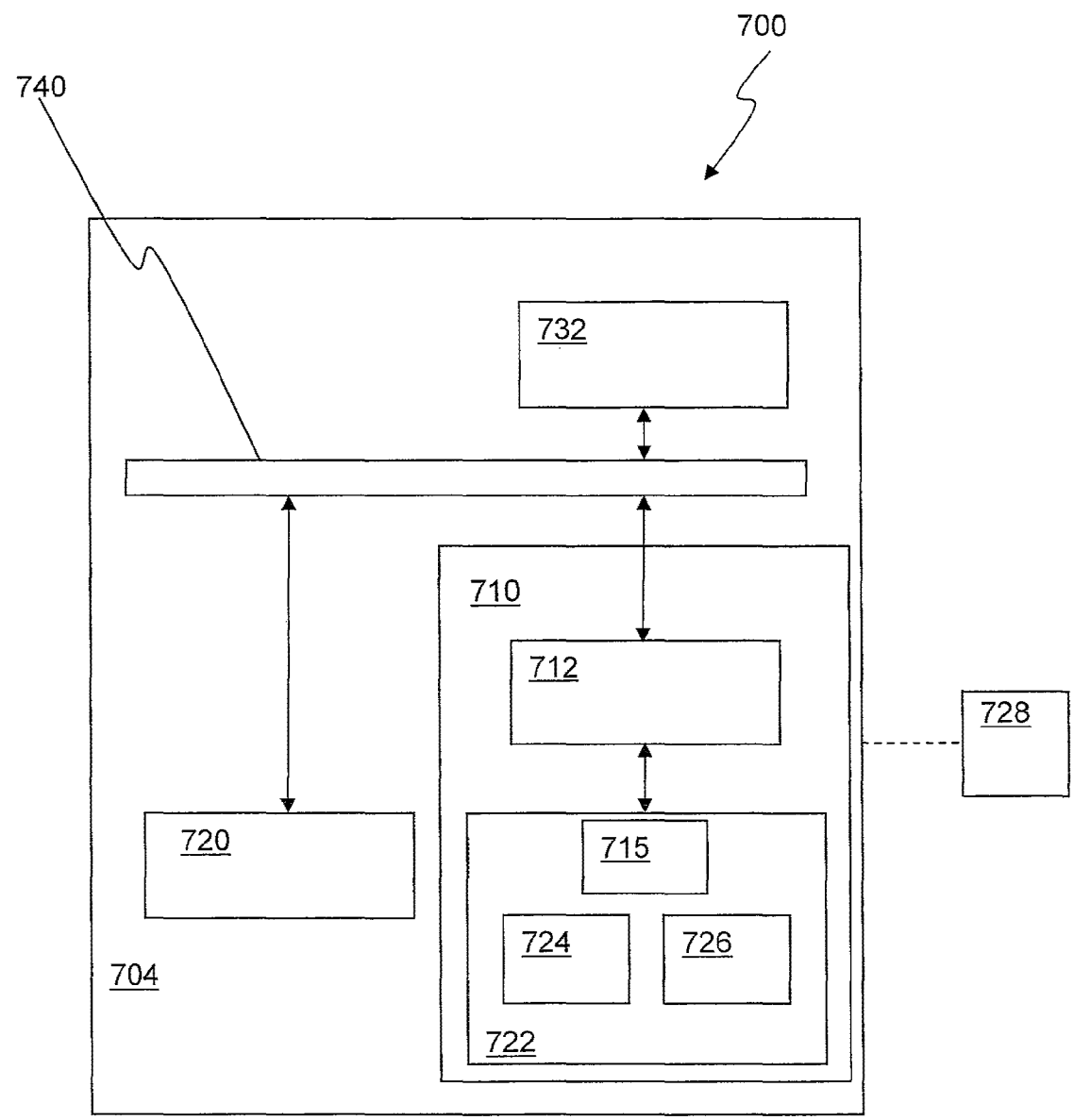
FIG. 7 is a schematic diagram illustrating an exemplary embodiment of a computing system.

FIG. 7 is a schematic diagram illustrating an exemplary embodiment of a computing system 700 including a memory device 710. Such a computing device may comprise one or more processors, for example, to execute an application and/or other code. For example, memory device 710 may comprise a number of data partitions and an ECC partition, as shown in FIG. 3. A computing device 704 may be representative of any device, appliance, or machine that may be configurable to manage memory device 710. Memory device 710 may include a memory microcontroller 715 and a memory 722. By way of example but not limitation, computing device 704 may include: one or more computing devices and/or platforms, such as, e.g., a desktop computer, a laptop computer, a workstation, a server device, or the like; one or more personal computing or communication devices or appliances, such as, e.g., a personal digital assistant, mobile communication device, or the like; a computing system and/or associated service provider capability, such as, e.g., a database or data storage service provider/system; and/or any combination thereof.

It is recognized that all or part of the various devices shown in system 700, and the processes and methods as further described herein, may be implemented using or otherwise including hardware, firmware, software, or any combination thereof. Thus, by way of example but not limitation, computing device 704 may include at least one processing unit 720 that is operatively coupled to memory 722 through a bus 740 and a host or memory microcontroller 715. Processing unit 720 is representative of one or more circuits configurable to perform at least a portion of a data computing procedure or process. By way of example but not limitation, processing unit 720 may include one or more processors, controllers, microprocessors, microcontrollers, application specific integrated circuits, digital signal processors, programmable logic devices, field programmable gate arrays, and the like, or any combination thereof. Processing unit 720 may include an operating system configured to communicate with memory microcontroller 715. Such an operating system may, for example, generate commands to be sent to memory microcontroller 715 over bus 740. Such commands may comprise read and/or write commands. In response to a read command, for example, memory microcontroller 715 may perform process 500 described above, to perform a read-while write process.

Memory 722 is representative of any data storage mechanism. Memory 722 may include, for example, a primary memory 724 and/or a secondary memory 726. Primary memory 724 may include, for example, a random access memory, read only memory, etc. While illustrated in this example as being separate from processing unit 720, it should be understood that all or part of primary memory 724 may be provided within or otherwise co-located/coupled with processing unit 720.

Secondary memory 726 may include, for example, the same or similar type of memory as primary memory and/or one or more data storage devices or systems, such as, for example, a disk drive, an optical disc drive, a tape drive, a solid state memory drive, etc. In certain implementations, secondary memory 726 may be operatively receptive of, or otherwise configurable to couple to, a computer-readable medium 728. Computer-readable medium 728 may include, for example, any medium that can carry and/or make accessible data, code, and/or instructions for one or more of the devices in system 700. Computing device 704 may include, for example, an input/output 732.

In a particular embodiment, computing system 700 may include memory device 722 comprising memory 724, and memory microcontroller 715 to calculate an ECC based, at least in part, on contents of individual memory array partitions in memory 724. In response to an attempt to read particular contents of a first portion of a particular one of the individual memory array partitions while writing to a second portion of the particular one of said individual memory array partitions, memory microcontroller 715 may determine the particular contents of the first portion based, at least in part, on the ECC. Computing system 700 may also include processing unit 720 to host one or more applications and to initiate read commands directed to memory microcontroller 715 to provide access to memory cells in memory 724, for example.

Input/output 732 is representative of one or more devices or features that may be configurable to accept or otherwise introduce human and/or machine inputs, and/or one or more devices or features that may be configurable to deliver or otherwise provide for human and/or machine outputs. By way of example but not limitation, input/output device 732 may include an operatively configured display, speaker, keyboard, mouse, trackball, touch screen, data port, etc.

The terms, "and," "and/or," and "or" as used herein may include a variety of meanings that will depend at least in part upon the context in which it is used. Typically, "and/or" as well as "or" if used to associate a list, such as A, B or C, is intended to mean A, B, and C, here used in the inclusive sense, as well as A, B or C, here used in the exclusive sense. Reference throughout this specification to "one embodiment" or "an embodiment" means that a particular feature, structure, or characteristic described in connection with the embodiment is included in at least one embodiment of claimed subject matter. Thus, the appearances of the phrase "in one embodiment" or "an embodiment" in various places throughout this specification are not necessarily all referring to the same embodiment. Furthermore, the particular features, structures, or characteristics may be combined in one or more embodiments.

While there has been illustrated and described what are presently considered to be example embodiments, it will be understood by those skilled in the art that various other modifications may be made, and equivalents may be substituted, without departing from claimed subject matter. Additionally, many modifications may be made to adapt a particular situation to the teachings of claimed subject matter without departing from the central concept described herein. Therefore, it is intended that claimed subject matter not be limited to the particular embodiments disclosed, but that such claimed subject matter may also include all embodiments falling within the scope of the appended claims, and equivalents thereof.

What is claimed is:

1. A method comprising:

receiving a read request to read contents of a memory array;

suspending calculation of an error correction code (ECC) m response to receiving the read request;

writing to the memory array while calculation of the ECC is suspended;

while writing to the memory array, determining contents of a portion of the memory array based on stored ECC; and subsequently resuming calculation of the ECC.

2. The method of claim 1, wherein determining the contents of the portion is further based on contents of other portions of the memory array that correspond to the portion of the memory array.

3. The method of claim 2, wherein the contents of the portion of the memory array are not used in determining the contents of the portion.

4. The method of claim 2, further comprising:

reading in parallel the contents of the other portions of the memory array that correspond to the portion of the memory array while determining the contents of the portion.

5. The method of claim 2, further comprising:

reading in series the contents of the other portions of the memory array that correspond to the portion of the memory array while determining the contents of the portion.

6. The method of claim 1, wherein writing to the memory array is in response to an internal operation initiated by a memory comprising the memory array.

7. The method of claim 1, wherein the portion of the memory array and an another portion of the memory array being written to share a group of sense amplifiers.

8. A memory microcontroller comprising:
an interface to connect to a memory array; and
electronic circuitry configured to:
  suspend calculation of an error correction code (ECC) in response to receiving a read request to read contents of the memory array;
  while writing to the memory array, determine one or more of the contents of the memory array based on stored ECC; and
  subsequently resume calculating the ECC.

9. The memory microcontroller of claim 8, wherein determining the one or more of the contents of the memory array is further based on other contents of the memory array that correspond to the one or more of the contents of the memory array.

10. The memory microcontroller of claim 9, wherein the one or more of the contents of the memory array are not used in determining the one or more of the contents of the memory array.

11. The memory microcontroller of claim 9, further comprising a circuit to:
  read in parallel the other contents of the memory array that correspond to the one or more of the contents of the memory array while determining the one or more of the contents of the memory array.

12. The memory microcontroller of claim 8, wherein a first portion of the memory array comprising the one or more of the contents of the memory array and a second portion of the memory array being written to are stored on a same data partition of the memory array.

13. The memory microcontroller of claim 12, wherein another data partition of the memory array comprises the stored ECC, the other data partition different from the same data partition comprising the first and second portions of the memory array.

14. The memory microcontroller of claim 8, wherein the contents of the memory array comprise the stored ECC.

15. The memory microcontroller of claim 8, wherein writing to the memory array comprises at least one of wear leveling, garbage collection, bad block management, or refresh process initiated by the memory microcontroller.

16. A system comprising:
  a memory device comprising a memory, the memory device further comprising a memory microcontroller configured to:
    suspend calculation of an error correction code (ECC) in response to receiving a read request to read contents of the memory;
    while writing to the memory, determine at least one content of the memory based on stored ECC; and
    subsequently resume calculating the ECC; and
  a processor to host one or more applications and to initiate the read request to the memory microcontroller to provide access to the memory.

17. The system of claim 16, wherein determining the at least one content of the memory is further based on other contents of the memory that correspond to the at least one content of the memory.

18. The system of claim 17, further comprising a circuit to:
  read in parallel the other contents of the memory that correspond to the at least one content of the memory while determining the contents of the memory.

19. The system of claim 17, wherein a first portion of the memory comprising the at least one content of the memory and a second portion of the memory comprising the other contents of the memory are stored on different data partitions of the memory.

20. The system of claim 16, wherein writing to the memory comprises writing to a first portion of the memory array, wherein a second portion of the memory comprises the at least one content of the memory, and wherein the first and second portions of the memory share a sense amplifier.

* * * * *

UNITED STATES PATENT AND TRADEMARK OFFICE
CERTIFICATE OF CORRECTION

PATENT NO. : 9,513,992 B2
APPLICATION NO. : 14/793475
DATED : December 6, 2016
INVENTOR(S) : Mirichigni It is certified that error appears in the above-identified patent and that said Letters Patent is hereby corrected as shown below:

In the Claims

Column 10, Lines 31-41, should read:
1. A method comprising:
    receiving a read request to read contents of a memory array;
    suspending calculation of an error correction code (ECC) in response to receiving the read request;
    writing to the memory array while calculation of the ECC is suspended;
    while writing to the memory array, determining contents of a portion of the memory array based on stored ECC; and
    subsequently resuming calculation of the ECC.

Signed and Sealed this
Fourth Day of April, 2017

Michelle K. Lee
*Director of the United States Patent and Trademark Office*